US012755071B2

(12) United States Patent
Quanz et al.

(10) Patent No.: US 12,755,071 B2
(45) Date of Patent: Oct. 6, 2026

(54) SCALABLE MODELING FOR LARGE COLLECTIONS OF TIME SERIES

(71) Applicant: INTERNATIONAL BUSINESS MACHINES CORPORATION, Armonk, NY (US)

(72) Inventors: Brian Leo Quanz, Yorktown Heights, NY (US); Wesley M. Gifford, Ridgefield, CT (US); Stuart Siegel, Millburn, NJ (US); Dhruv Shah, White Plains, NY (US); Jayant R. Kalagnanam, Briarcliff Manor, NY (US); Chandrasekhar Narayanaswami, Wilton, CT (US); Vijay Ekambaram, Chennai (IN); Vivek Sharma, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 993 days.

(21) Appl. No.: 17/232,099

(22) Filed: Apr. 15, 2021

(65) Prior Publication Data

US 2022/0147669 A1 May 12, 2022

Related U.S. Application Data

(60) Provisional application No. 63/111,006, filed on Nov. 7, 2020.

(51) Int. Cl.
*G06F 30/27* (2020.01)
*G06N 20/00* (2019.01)
*G06Q 10/04* (2023.01)

(52) U.S. Cl.
CPC ............ *G06F 30/27* (2020.01); *G06N 20/00* (2019.01); *G06Q 10/04* (2013.01)

(58) Field of Classification Search
CPC ......... G06F 30/27; G06N 20/00; G06Q 10/04
See application file for complete search history.

(56) References Cited

U.S. PATENT DOCUMENTS 6,735,580 B1 5/2004 Li et al.
10,318,874 B1 6/2019 Duncan et al.
(Continued)

FOREIGN PATENT DOCUMENTS

CN 108256694 A 7/2018
CN 110737528 A 1/2020
(Continued)

OTHER PUBLICATIONS

International Search Report and Written Opinion issued Jan. 26, 2022 in related application No. PCT/CN2021/126412; 10 pgs.
(Continued)

*Primary Examiner* — Sherrod L Keaton
*Assistant Examiner* — Nicholas S Wu
(74) *Attorney, Agent, or Firm* — CHIP LAW GROUP

(57) ABSTRACT

In various embodiments, a computing device, a non-transitory storage medium, and a computer implemented method of improving a computational efficiency of a computing platform in processing a time series data includes receiving the time series data and grouping it into a hierarchy of partitions of related time series. The hierarchy has different partition levels. A computation capability of a computing platform is determined. A partition level, from the different partition levels, is selected based on the determined computation capability. One or more modeling tasks are defined, each modeling task including a group of time series of the plurality of time series, based on the selected partition level. One or more modeling tasks are executed in parallel on the computing platform by, for each modeling task, training a
(Continued)

200 model using all the time series in the group of time series of the corresponding modeling task.

20 Claims, 8 Drawing Sheets

(56) References Cited

U.S. PATENT DOCUMENTS

| | | | | |
|---|---|---|---|---|
| 10,339,235 | B1 * | 7/2019 | Ciarlini | G06F 30/20 |
| 10,685,283 | B2 | 6/2020 | Li et al. | |
| 11,755,004 | B2 | 9/2023 | Natsumeda | |
| 12,511,164 | B2 * | 12/2025 | Makaya | G06F 9/505 |
| 2012/0150764 | A1 | 6/2012 | Sadegh | |
| 2015/0052173 | A1 * | 2/2015 | Leonard | G06F 16/2477 707/792 |
| 2018/0164794 | A1 | 6/2018 | Nikovski et al. | |
| 2018/0349930 | A1 | 12/2018 | Blomberg et al. | |
| 2019/0050763 | A1 * | 2/2019 | Panda | G06F 18/23 |
| 2019/0156243 | A1 | 5/2019 | Li et al. | |
| 2019/0317952 | A1 * | 10/2019 | Li | G06F 16/2246 |
| 2020/0004449 | A1 * | 1/2020 | Rath | G06F 9/5061 |
| 2020/0034745 | A1 * | 1/2020 | Nagpal | G06N 5/022 |
| 2020/0296155 | A1 * | 9/2020 | McGrath | G06F 9/5027 |
| 2021/0089921 | A1 * | 3/2021 | Aghdasi | G06N 5/04 |
| 2021/0303969 | A1 * | 9/2021 | Amiri | G06N 3/08 |
| 2023/0195591 | A1 * | 6/2023 | Higginson | G06Q 10/04 702/186 |

FOREIGN PATENT DOCUMENTS

| | | | |
|---|---|---|---|
| CN | 111309861 | A | 6/2020 |
| CN | 116569193 | A | 8/2023 |
| DE | 112021004958 | T5 | 7/2023 |
| GB | 2617922 | A | 10/2023 |
| JP | 2019-012654 | A1 | 3/2020 |
| JP | 2023-547451 | A | 11/2023 |
| RU | 2411686 | C2 | 2/2011 |
| WO | 2022/095755 | A1 | 5/2022 |

OTHER PUBLICATIONS

Mell, P. et al., "Recommendations of the National Institute of Standards and Technology"; NIST Special Publication 800-145 (2011); 7 pgs.

Eck, B. et al., "Scalable Deployment of AI Time-series Models for IoT"; arXiv:2003.12141v1 (2020); 7 pgs.

Sen, R. et al., "Think Globally, Act Locally: A Deep Neural Network Approach to High-Dimensional Time Series Forecasting"; 33rd Conference on Neural Information Processing Systems (2019), Vancouver, Canada; 7 pgs.

Amazon Forecast Developer Guide (2020); 283 pgs.

Taylor, S. J. et al., "Forecasting at Scale"; Open Access (2017); 25 pgs.

Huang, S. et al., "Scalable AutoML for Time Series Forecasting Using Ray"; Intel Corporation (2020); 24 pgs.

Quick Start Prophet, https://facebook.github.io/prophet/docs/quick_start.html, (2020); 12 pgs.

Japan Patent Office, "Notice of Reasons for Refusal," Jan. 28, 2025, 6 Pages, JP Application No. 2023-526040.

The State Intellectual Property Office of People's Republic of China, "First Office Action", Nov. 26, 2025, 20 Pages, CN Application No. 202180071684.2.

Auder et al., "Scalable Clustering of Individual Electrical Curves for Profiling and Bottom-Up Forecasting", Energies, Jul. 20, 2018, 22 pages, doi: https://doi.org/10.3390/en11071893.

Hai-Qi et al., "Local Neural Networks of Space Time Modeling Based on Partitioning for Lattice Data in GIS", Journal of Remote Sensing, Sep. 2008, 9 pages (abstract only).

The State Intellectual Property Office of People's Republic of China, "The Second Office Action", Mar. 18, 2026, 11 Pages, CN Application No. 202180071684.2.

Yi-Ming et al., "A Comparative Study on Time Series Classification", Chinese Journal of Computers, vol. 30, No. 8, Aug. 2007, 8 pages (abstract only).

* cited by examiner

SCALABLE MODELING FOR LARGE COLLECTIONS OF TIME SERIES

BACKGROUND

Technical Field

The present disclosure generally relates to time series forecasting, and more particularly, to improving the statistical accuracy and computational efficiency of a computing device performing time series forecasting.

Description of the Related Art

A time series is a series of data points indexed in time order, such as a series of data collected sequentially at a fixed time interval. Time-series forecasting is the use of a model to predict future values for a time series based on previously observed values of the time series. Forecasting across a large number of related time series is a salient aspect of many practical industry problems and applications. Indeed, it can be the core component that drives subsequent decision, optimization, and planning systems and processes.

Today, data-sets can have millions of correlated time-series over several thousand time-points. By way of non-limiting examples, electricity forecasting (e.g., predicting power usage across different geographies and time), road traffic analysis, etc., may involve an extremely large number of time series, sometimes referred to as big data. The large number of time series along with the increase in number of models, model complexity, variations, and possible ways of including external data that are to be automatically searched as part of the modeling process, causes a prohibitive computational challenge when performing multi-time series modeling.

Existing systems and methods for forecasting cannot scale to a level that can accommodate such large volume of time series, let alone while bringing state of the art (SOTA) forecasting components and models to bear (which provide cross-series modeling)—both in terms of data size (which can fail to fit in memory of a computing architecture) and modeling across all available time series that create a very large data situation. Accordingly, traditional computing systems cannot efficiently accommodate (if at all) the training and use of models based on a large volume of time series data. Furthermore, using the entire available time series data to fit a model may involve an overall large and complex model, further exacerbating scalability, whereas not using multiple time series still requires fitting a large number of models, but may not provide enough data to accommodate complex models such as machine learning (ML) and/or deep learning (DL) models and learning relationships with the large amounts of exogenous data.

SUMMARY

According to various embodiments, a computing device, a non-transitory storage medium, and a computer implemented method of improving a computational efficiency of a computing platform in processing a time series data is provided. A time series data comprising a plurality of time series is received. The time series data is grouped into a hierarchy of partitions of related time series. The hierarchy has different partition levels. A computation capability of a computing platform is determined. A partition level, from the different partition levels, is selected based on the determined computation capability. One or more modeling tasks are defined, each modeling task including a group of time series of the plurality of time series, based on the selected partition level. One or more modeling tasks are executed in parallel on the computing platform by, for each modeling task, training a model using all the time series in the group of time series of the corresponding modeling task.

In one embodiment, each partition level includes a plurality of groups of time series, based on the time series data.

In one embodiment, each partition level includes a substantially similar number of time series.

In one embodiment, the determination of the computation capability includes receiving the computation capability from a reference database.

In one embodiment, the determination of the computation capability includes performing an initial approximation by performing partial modeling at a plurality of the partition levels on the computing platform.

In one embodiment, the selection of the partitioning level is based on a highest time efficiency for a predetermined accuracy.

In one embodiment, the selection of the partitioning level is based on a highest accuracy for a predetermined time efficiency.

In one embodiment, for each modeling task, a cross-time-series modeling is performed, at the selected level, in parallel.

In one embodiment, the grouping of the time series is performed by a domain-based and/or semantic model-based grouping.

In one embodiment, the computing platform includes a plurality of computing nodes. The determination of the computation capability of a computing platform is performed separately for each node.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Overview

Figure 1:
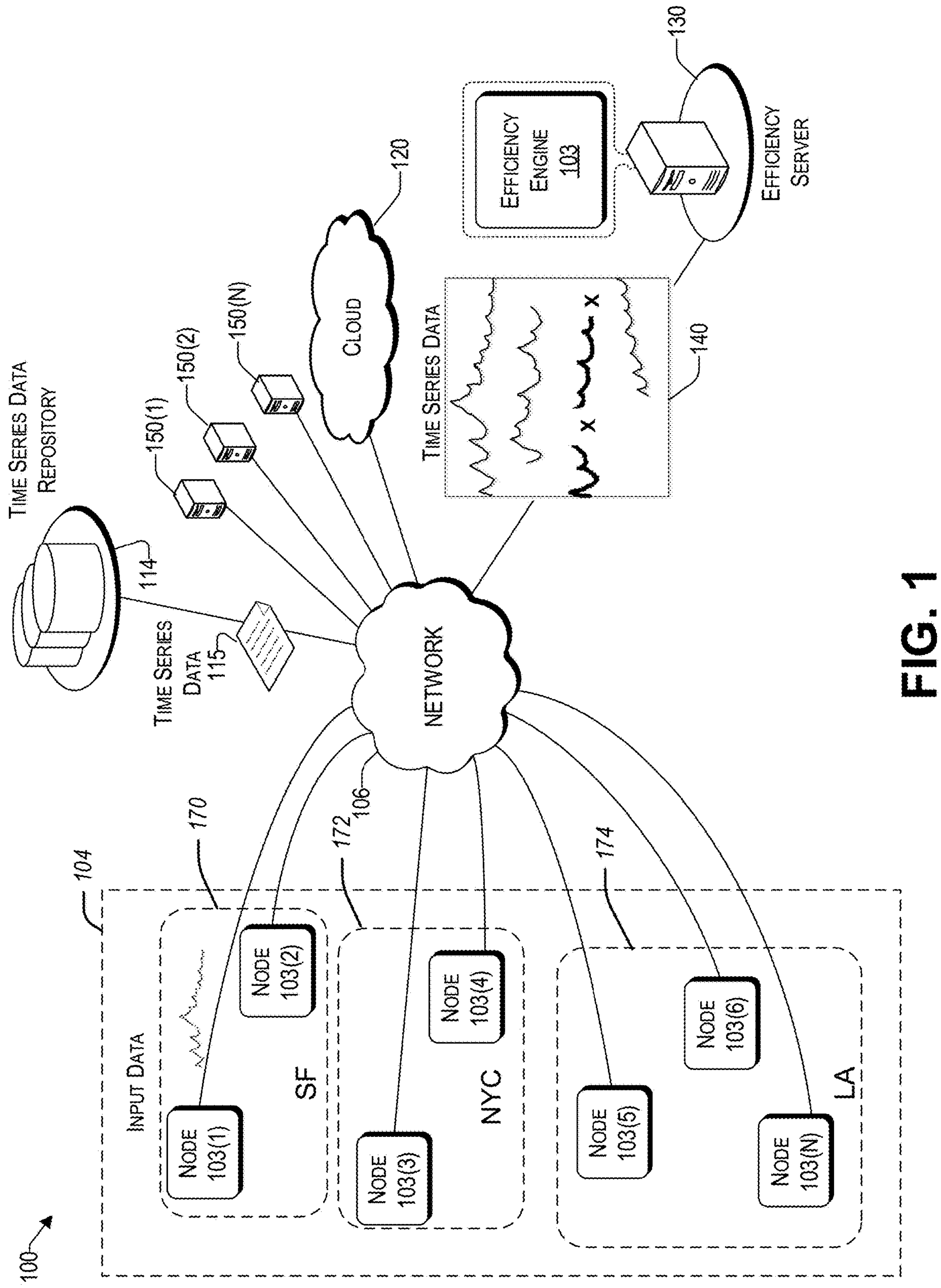
FIG. 1 illustrates an example architecture that may be used to implement a system for a scalable modeling of large collections of time series data.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The present disclosure relates to systems and methods of scalable modeling for large collections of time series. Today, industry involves forecasts to drive planning and operations. However, the number of time series along with the explosion of data processing and model variations and data to incorporate and explore creates a prohibitive computational challenge that current forecast systems can't meet on a computing platform. For example, computing platforms may not have sufficient computational resources to perform the calculations and/or it may take too long to receive forecast results. The situation is exacerbated for latest state-of-the-art ML/DL forecast models, which may involve cross-series modeling—that is, using the data from all series fed into the model to fit the forecast model parameters and harvest forecasts out of the model.

The industry struggles to scale forecasting to the large number of time series that may be available and typically sacrifices accuracy of forecasting models (e.g., in terms of pipeline/model and feature complexity, models searched over, and exogenous data included) in order to enable tractable modeling, potentially resulting in degraded computational accuracy of the computing device performing these calculations. Further, todays' industry may have no way to bring the latest state-of-the-art forecasting components, such as artificial intelligence (AI)/deep learning (DL) methods and forecasting techniques to fully leverage the large amounts of data (Big Data) to facilitate the forecasting tasks. Indeed, there is very limited application of AI and especially DL in commercial forecasting, let alone cross-series or multivariate models leveraging information from all the series in the model.

By way of example and not by way of limitation, a goal in demand planning/forecasting may be to predict future demand or sales given observed history of sales or demand and other exogenous factors, where the time series are the sequence of sales at a predetermined resolution (e.g., daily sales). For example, in a supply chain, each entity may rely on down-stream forecasts to determine the volume of product to prepare and/or to ship to meet that demand, and up-stream forecasts to predict the volume of supply they can obtain from different suppliers. For example, retailers may need to forecast the demand for each of potentially millions of products at potentially thousands of different locations (e.g., stores) to determine the requisite volume retailers to re-order periodically and determine the volume of product to replenish to each location periodically (e.g., weekly, monthly, etc.). Each of these product-store combinations provides one time series. The result may be millions or even billions of time series data.

Other examples include traffic forecasting (which may be physical, as in road traffic, or virtual, as in internet traffic) at different locations and times; electricity forecasting (e.g., predicting power usage across or geography at different times; manufacturing and internet of things (IoT) sensor time series modeling (e.g., forecasting for hundreds of thousands of different sensors and locations). There are many challenges associated with time series data from different nodes or even from the same node. For example, the time series may not be aligned, missing values, include a large amount of exogenous data (e.g., weather events), the data may be sparse, etc.

In one aspect, the teachings herein make the forecasting for large numbers of time series and large data with state-of-the-art forecasting techniques both scalable and effective (i.e., computationally feasible on a given computing platform and improving accuracy thereof) by automatically determining an appropriate partition level of time series to perform cross-series modeling in parallel, where each partition forms a forecasting task that can be run in parallel. Additionally, the teachings herein facilitate cross-time-series machine learning algorithms to be leveraged, which provide the latest state-of-the-art approaches to forecasting, as well as modeling or sharing model parameters across time series and multi-task and/or multivariate models, to improve forecasting accuracy, as well as to including the growing amount of exogenous data for external factors like weather, events, social media, etc.

By virtue of the teachings herein, an entity can upload their data, specify set of models to try, time periods to train and evaluate, and efficiently receive forecasting model evaluation results and forecasting models to deploy and use. The system automatically translates the specified forecasting tasks to appropriate and appropriately distributed/parallel computation tasks to accommodate the computing resources available, thereby not only making the processing possible, but also more accurate on a given computing platform. Data scientists can readily explore modeling flows and variations and determine the results at scale, without having to sacrifice accuracy to come to an understanding. The architecture improves computational efficiency and processing speed by being able to partition time series data into groups that can be processed concurrently (i.e., in parallel). Reference now is made in detail to the examples illustrated in the accompanying drawings and discussed below.

Example Architecture

FIG. 1 illustrates an example architecture 100 that may be used to implement a system for a scalable modeling of large collections of time series data. Architecture 100 includes input data 104 from a plurality of nodes 103(1) to 103(N). The nodes may be in a same region or dispersed. For example, nodes 103(1) and 103(2) may be in a first region 170 (e.g., Kentucky), nodes 103(3) and 103(4) may be in a second region 172 (e.g., NYC), nodes 103(5) to 103(N) may be in a third region (e.g., LA), and so forth. As used herein, a node is a source of serial information. For example, it can be retail store providing information regarding various products, a sensor providing traffic and/or weather information, etc.

The network 106 may be, without limitation, a local area network ("LAN"), a virtual private network ("VPN"), a cellular network, the Internet, or a combination thereof. For example, the network 106 may include a mobile network that is communicatively coupled to a private network, sometimes referred to as an intranet that provides various ancillary services, such as communication with a time series data repository 114. To facilitate the present discussion, network 106 will be described, by way of example only and not by way of limitation, as a mobile network as may be operated by a carrier or service provider to provide a wide range of mobile communication services and supplemental services or features to its subscriber customers and associated mobile device users.

In one embodiment, there is a time series data repository 114 is configured to store the large volume of time series data generated by the nodes 103(1) to 103(N)—i.e., each node corresponds to a time series. The time series data 115 of the time series data repository 114 can be provided to the efficiency server 130 at predetermined intervals or upon a trigger event (e.g., request from the efficiency server 130). In some embodiments, the time series data 140 is received by the efficiency server 130 directly from the nodes 103(1) to 103(N).

The architecture 100 includes a time series efficiency engine 103, which is a program that runs on the efficiency server 130. The efficiency engine 103 is configured to receive time series data 115 from the time series data repository 114 and/or directly from the nodes 103(1) to 103(N). The efficiency engine 103 is operative to perform hierarchical partitioning of the large volume of time series data. In various embodiments, domain-based grouping may be used and/or data based grouping, discussed in more detail later. Upon this initial grouping, a grouping level is automatically determined by the efficiency engine 103. Each group of time series data represents a modeling task that is to be processed by a computing device represented by computing nodes 150(1) to 150(N). The tasks are distributed to one or more computing devices 150(1) to 150(N) to execute the tasks in parallel. By virtue of distributing the computational load represented by the groups of time series data, the processing time is reduced while the accuracy is also potentially improved by enabling focused models per group. Each of these concepts is discussed in more detail below.

The efficiency engine 103 is configured to automatically partition time series data to create tasks to run in parallel on one or more computing devices. In one aspect, modeling across multiple series (e.g., vs. training a single model per series) provides an improvement both in terms of scalability and performance for machine-learning (ML) and deep learning (DL) based modeling. A single time series may not have sufficient data to enable an accurate training of a complex model. The situation is exacerbated when exogenous data is introduced, which invokes leveraging multiple related time series to learn common patterns (both across the time series and from exogenous data) as well as including relationships between the related series, such as correlation and dependence, both in multitask modeling and multivariate modeling.

However, too many series included for one model also leads to lack of scalability and unnecessary complexity—both the data size and model size becomes too large, and the model must become large enough to encode multiple different types of relationships, which might be more easily captured with separate models.

For example, a retailer may sell both electronics and clothing—but these genres do not generally have much in common or cross-relationships, and there may be sufficient data in each genre to capture more general patterns. Indeed, there would only be added complexity from training a model across both groups. Accordingly, it would be better in such scenario to train a separate model for each genre. In this regard, the efficiency engine 103 is able to determine what partitioning of time series should be done to perform modeling per each group (partition). Such partitioning enables more effective modeling because it enables the models to be more accurate, as each model is restricted to more relevant data. Further, the models can be less complex by virtue of not having to deal with disparate information. The whole pipeline of the efficiency engine 103 (and all forecasting steps) can be tuned for a particular partition (as different groups could require completely different settings for components).

The partitioning of the efficiency engine 103 also enables much greater scalability—as each partition modeling task can be run in parallel on each computing node (e.g., 150(1) to 150(N)), with each computing node receiving a reduced time series data size. In one embodiment, information from other partitions can also be included in modeling each partition at an aggregate level (e.g., taking mean value series from each other group).

For purposes of discussion, different computing devices (e.g., 150(1) to 150(N) and 130) appear in the drawing, to represent some examples of the devices that may be used to partition the time series data and processing therefor. Today, computing devices typically take the form of tablet computers, laptops, desktops, personal digital assistants (PDAs), portable handsets, smart-phones, and smart watches, although they may be implemented in other form factors, including consumer, and business electronic devices. The efficiency engine provides a technological improvement in configuring its host into a particularly configured computing device that is able to enhance the capability of one or more computing devices to be able to process a vast amount of time series data. While the time series data repository 114 and efficiency server 130 are illustrated by way of example to be on different platforms, in various embodiments, these platforms may be combined in various combinations. In other embodiments, one or more of these computing platforms may be implemented by virtual computing devices in the form of virtual machines or software containers that are hosted in the cloud 120, thereby providing an elastic architecture for processing and storage, discussed in more detail later. Thus, the functionality described herein with respect to each of the time series data repository 114 and efficiency server 130 can also be provided by one or multiple different computing devices.

Example Block Diagram

Figure 2:
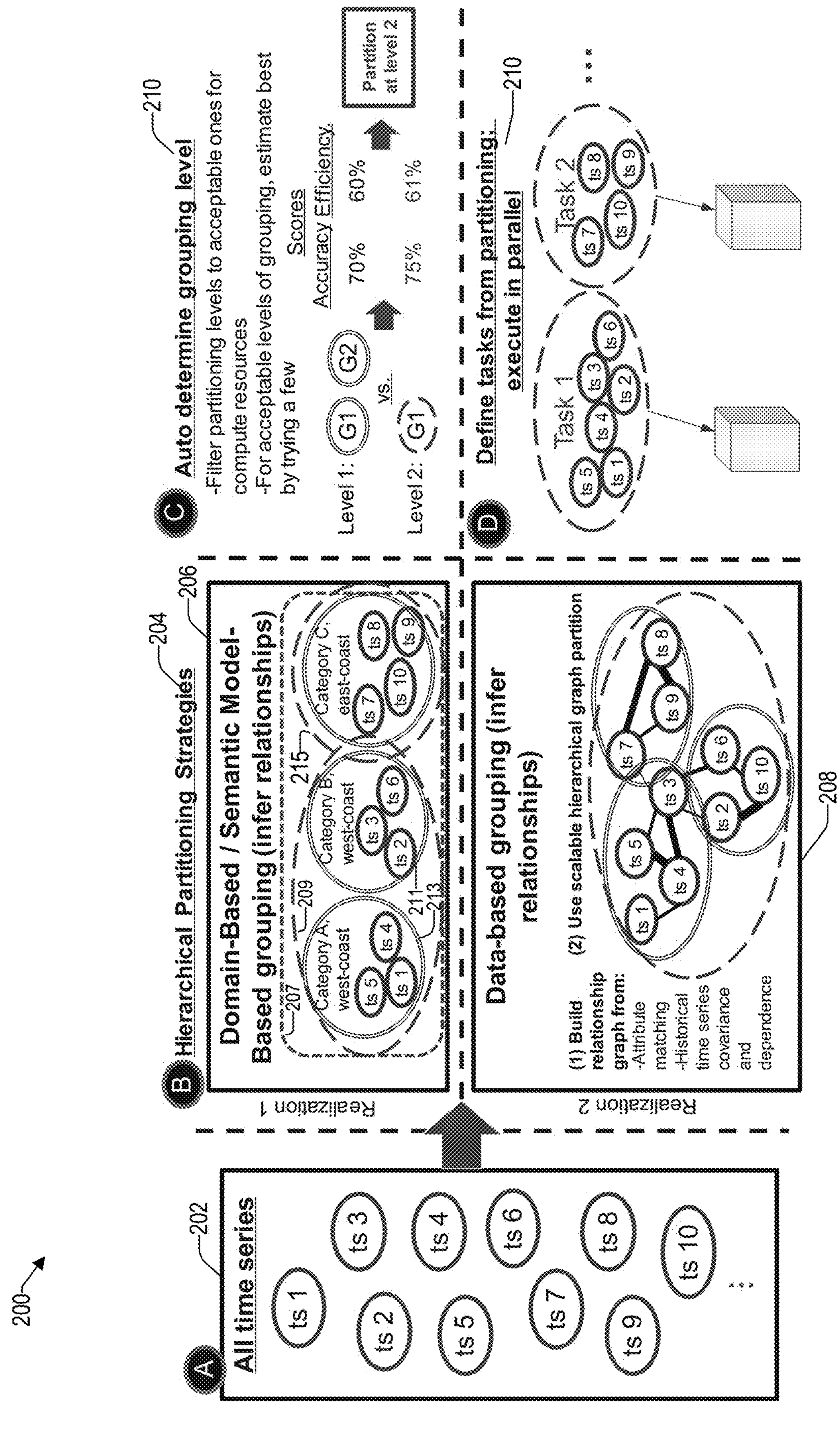
FIG. 2 is a block diagram of a system for time series partitioning and task creation, consistent with an illustrative embodiment.

FIG. 2 is a block diagram of a system 200 for time series partitioning and task creation, consistent with an illustrative embodiment. For discussion purposes, the block diagram of FIG. 2 is described with reference to the architecture 100 of FIG. 1. System 200 illustrates that there are three main actions performed by the efficiency engine 103 to automatically partitioning time series to run time series modeling in parallel. First, the time series data 202 is received by the efficiency engine 103 and a hierarchical partitioning is performed. The partitioning is hierarchical in that there may be partitions with larger group sizes (and fewer total groups) and sub-partitions with smaller group sizes (and more total groups). For example, a largest group size partition 207 may include a most loose criteria for inclusion (e.g., same region, same store, etc.,) and therefore include the largest group (i.e., time series (ts 1 to ts 10) in the present example). A tighter partition group represents a set of times series that is more likely to be related and benefit from cross-series modeling 209. The tightest partition group is referred to herein as a level 1 partition group (or grouping) and the level increases as the groups introduce more time series. The first level partition has tighter criteria for inclusion (e.g., same product line in a region) (e.g., 211, 213).

In various embodiments, different hierarchical partitioning strategies 204 may be used. In one embodiment, domain-based and/or semantic model-based grouping may be used, represented by block 206. In another embodiment data-based grouping may be used to infer relationships between data, represented by block 208. Data-based grouping is grouping based on the time series history and properties itself—i.e., not a pre-specified set of groupings but one computed automatically based on the data itself (i.e., data-driven). For example, one embodiment of data-based grouping may involve clustering the time series based on their historic patterns and magnitudes—e.g., using time series similarity and distance measures like dynamic time warping (DTW) distance or correlation in combination with hierarchical clustering algorithms, such as hierarchical agglomerative clustering or iterative k-means clustering, using the time series distance metrics. Another example embodiment is using attributes of the time series, including summary statistics of the historical series values, such as mean, maximum, variance, naïve/last-value forecast error, trend and seasonal sensitivity, as well known attributes such as category labels (e.g., product category, product class, market segment, store count, store state/region, etc., in the retail case), as features to apply the hierarchical clustering. Another embodiment may be to derive a graph, with each time series as a node in the graph, representing different types of relationships between the time series as different links in the graph connecting nodes, with different weights representing the strength of the relationship. These links can be derived from different relationships, including previously mentioned correlation, time series distance, attribute similarities, etc. Hierarchical graph partitioning/clustering algorithms can then be applied to this graph to form the different levels of partitions. Other techniques for hierarchical partitioning are supported by the teachings herein as well. Further, constraints on the group sizes can also be included, enforcing that the size (i.e., number of time series) in each group for a given partitioning level, is not too different—so that the modeling task and its complexity and computational burden will be similar for each group in the same partition level. This can be accomplished by way of different embodiments. For example, in one embodiment, using hierarchical agglomerative clustering, the cluster sizes at each hierarchy level will always be within a fixed size range. In other embodiments, such as for algorithmic clustering, a size similarity constraint can be added to the clustering optimization problem. In some embodiments, post-processing of the clusters (such as merging too-small clusters or splitting too-big clusters) can be used.

In one embodiment, each group in a partition can also include one or more aggregate series from the other groups, such as a global aggregate (e.g., mean value series) from the other groups, or an aggregate series per group—to enable leveraging any additional information from the other groups in a scalable way. Such approach can improve modeling at each hierarchy level.

Second, the efficiency engine 103, determines the partition level to use 210. To that end, the efficiency engine may trade off modeling accuracy with modeling time. The goal is to find the right level of partitioning to train the model, in the hierarchical partitioning, that will provide modeling accuracy that is at a predetermined desired level, while providing scalability. To that end, the efficiency engine may make an initial determination of the computing capability of the computing device performing the calculations, referred to herein as an initial approximation. In various embodiments, the initial approximation may be received directly from each computing device or a reference database that stores the capabilities of a computing device (e.g., number of processors and cores, amount of memory, clock speed, present load, etc.,). Based on the initial approximation, a partition level is selected that is able to process the time series data in a predetermined time period. In one embodiment, it is assumed that the computing nodes are homogenous and the performance of one computing node is representative of the others. Alternatively, each computing node 150(1) to 150(N) is evaluated independently.

In one embodiment, the efficiency engine 103 performs a test by performing partial modeling for a subset (e.g., one or more groups) from each level from the set of candidate levels (in parallel) to test accuracy and computation time for each. In this way, the computational capability is determined. Upon determining the computational capability of the computing device performing the processing of the time series data, a partitioning level is selected that can accommodate the processing of the time series data in a predetermined time period and a predetermined threshold accuracy. In the example of FIG. 2, the efficiency engine 103 determines that a level 2 partition (which includes group 1 (e.g., 215) and group 2 (e.g., 209) as 2 different groups in the partition to be modeled separately and simultaneously) provides the better accuracy and efficiency—and this can be based on simply testing a subset of groups at the level (e.g., level 2 being tested) initially—such as group 1 (e.g., 215) only, for a subset of modeling configurations, and comparing to similar tests at other levels. For example, the partitioning levels to choose from may be: level 0—which includes each individual time series in its own group—in which case a model is fit separately to each individual time series; level 1—which includes 211, 213, and 215 as 3 different groups—a separate model is fit to each of the 3 groups in parallel; level 2, which includes 209 and 215 as 2 different groups in that level that can be modeled independently; and level 3=207—which corresponds to fitting one model across all time series (modeling the whole set of time series together). Moving up or down this hierarchy results in different results in both terms of accuracy and efficiency—both might increase from level 0 up to a point (say level 1 or 2) and start to decrease for higher levels, for example.

Upon determining that this level can be accommodated by the computing device, that level of partitioning is chosen. Each group at that partition level is deemed a task to be performed in parallel by separate computing devices. In one embodiment, each group at a partition level takes a similar amount of computing resources. In this way, all computations are completed within a predetermined range of time.

Third, the efficiency engine executes each task on a corresponding computing node in parallel. Now that an appropriate hierarchy level is chosen, full modeling for all groupings at that level can be performed. As mentioned above, in some embodiments, it is assumed that the computing nodes 150(1) to 150(N) are homogenous. However, in scenarios where it is determined that the computing nodes are heterogenous, in various embodiments, the work is distributed in parallel based on the lowest performing computing node or the tasks can be partitioned in such a way to accommodate the capability of the corresponding computing node. For example, the efficiency engine 103 can assign appropriately to each node based on the group size and estimated task complexity (assigning smaller/easier tasks to the less powerful computing nodes).

Example Forecasting Components

Figure 3:
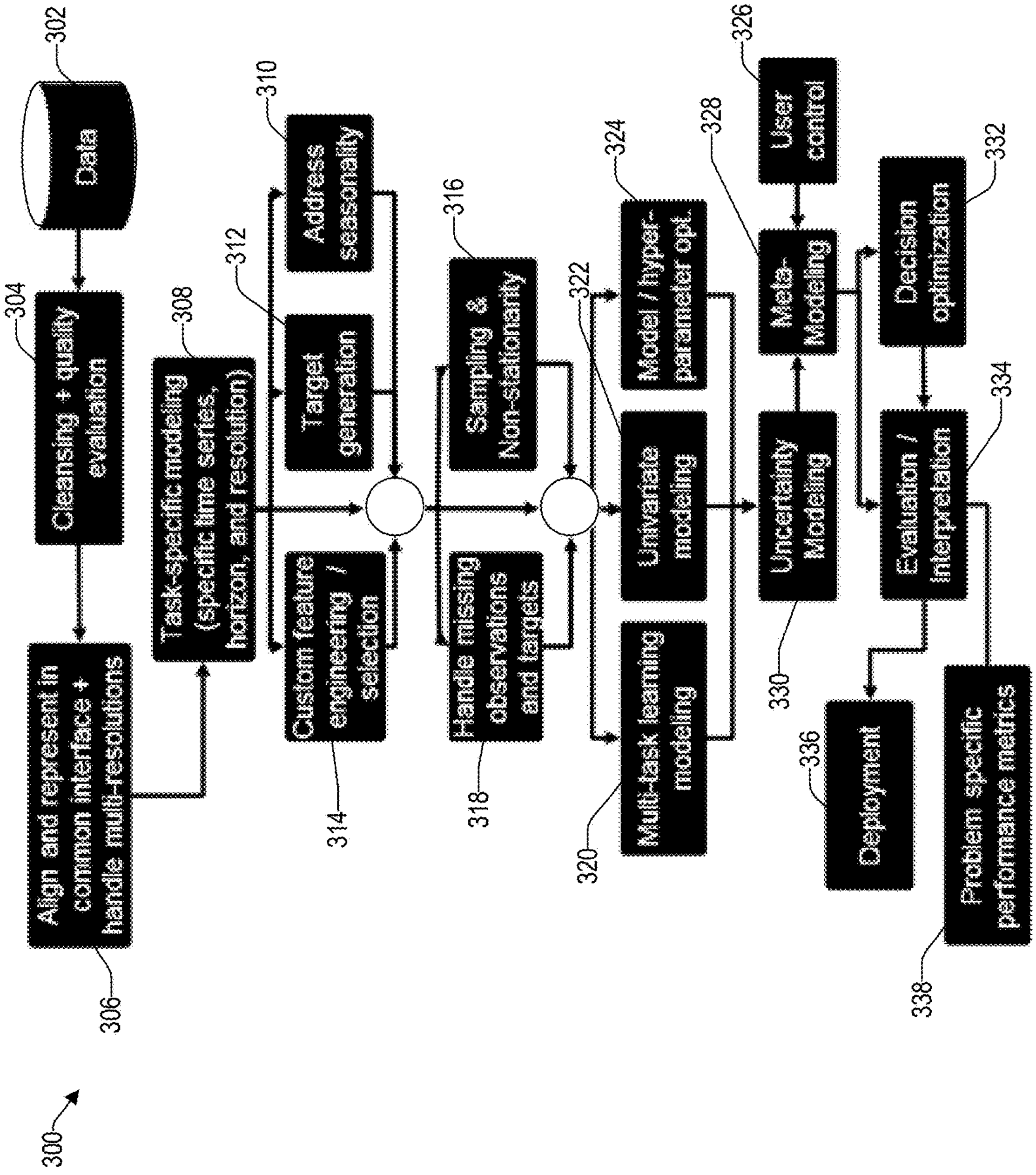
FIG. 3 provides a conceptual block diagram of different forecasting components and how they interrelate, consistent with an illustrative embodiment.

Forecasting involves predicting multiple, related, time series and their uncertainty across multiple horizons, at scale to feed into down-stream decision and optimization systems. In this regard, reference is made to FIG. 3, which provides a conceptual block diagram 300 of different forecasting components and how they interrelate, consistent with an illustrative embodiment. A large volume of time series data 302 is received by the efficiency engine. At block 304, the quality of the data may be evaluated and cleaned accordingly. For example, outlier detection and correction can be performed (such as in a simple way data that varies beyond a predetermined standard deviation is filtered out or winsorized). In one embodiment, missing dates and missing values can be addressed by filling in these values appropriately and flagging them in the data. At block 306, the time series data is virtually aligned by assigning time stamps to all time point values and filling in missing time points in the sequence data (with missing flag values) so data for each time point can be appropriately referenced, and provided in a common interface and the possible different resolutions of the time series data are resolved (e.g., by providing values at the highest resolution and either imputing/interpolating, repeating, or flagging as missing values at the lower resolution for their missing high-resolution time points).

At block 308 modeling is managed and the serial data is prepared for multiple tasks, each of which may have different features, targets, settings, and so forth. Each task is a predictive task that could include, for example, predicting time series values for different horizons and time offsets. For example, predicting the next day total shipments for retail time series could be one task, another could be predicting the shipments for the week after next week, another could be predicting the average shipments for the month after next month, etc. This can also include sub-tasks that go into making the final prediction—such as using a predictive model to first fill in missing values, before using a forecast model to predict future values, using those filled-in values. At block 310 the modeling of seasonality effects are addressed via transformations, models, etc. For example, seasonality effects may be regular, typically cyclical patterns of time series that are often common across a set of related time series—such as a weekly pattern where certain days of a week have larger values than others or an hourly pattern. For example, in retail, there is often a weekly seasonal pattern shared for different regions of stores, where sales increase during the weekend and decrease in the middle of the week, as well as a holiday seasonal pattern where sales are much higher during the weeks around the Thanksgiving holiday. As another example, in electricity consumption, there is typically an hourly pattern where energy uses in different location types spike at different times, such as home energy use spiking after work and decreasing into the late night time. Modeling seasonal effects amounts to accounting for these which can either be done by fitting separate seasonal models or decompositions as earlier steps, or incorporated as part of the time series prediction model itself. The efficiency engine may provide a target generation 312. Target generation is computing and generating the prediction target for each of the salient prediction tasks (e.g., generating the sum of values for each time series in the next week, for each time point, corresponding to a next-week-sum prediction task).

At block 314 features specific to the problem may be addressed with different sets of transformations. Time series data may have missing features, such as dates and/or values. To that end, at block 318, the missing features are cured. Time series data may be subject to drift. For example, the underlying nature and pattern of the time series may change over time. Stated differently, the distribution of the time series may be non-stationary and may have elements where the distribution gradually shifts or changes over time. For example, in the case of energy demand, demand for a energy may follow regular cyclical seasonal patterns, but the base level of demand may slowly change over time, sometimes in a random drift manner, or slowly increase or decrease over time. In this regard, at block 316, the drift is resolved. Different techniques can be used to handle drift, such as sample weighting when training the model at a current time, to emphasize the most recent time points more heavily as well as focus the modeling and those time points that are more reflective of the current state.

Another consideration by the efficiency engine may be the different types of learning. For example, there may be multi-task learning modeling 320, univariate modeling 322, and model/hyperparameter optimization 324. Demand signals often have nonlinear relationships between different factors, flexible machine learning/deep learning models may be used. Certain forecasts may use external data, such as weather, plans, competitor information, event information, etc.

In one embodiment, the efficiency engine performs uncertainty modeling (i.e., block 330). For example, the efficiency engine may model (and evaluate) prediction distributions, which is salient for forecasting to enable real use and down-stream systems. The uncertainty modeling 330 together with user control 326, can be used to perform meta modeling 328. In turn, the meta modeling 328 can be used for decision optimization 332 and evaluation/interpretation (i.e., 334) of the time series data. The evaluation/interpretation module 334 may use problem specific performance metrics, together with the meta modeling information 328 and decision optimization 332 information to provide an efficient deployment and updatable models and data structures.

Figure 4:
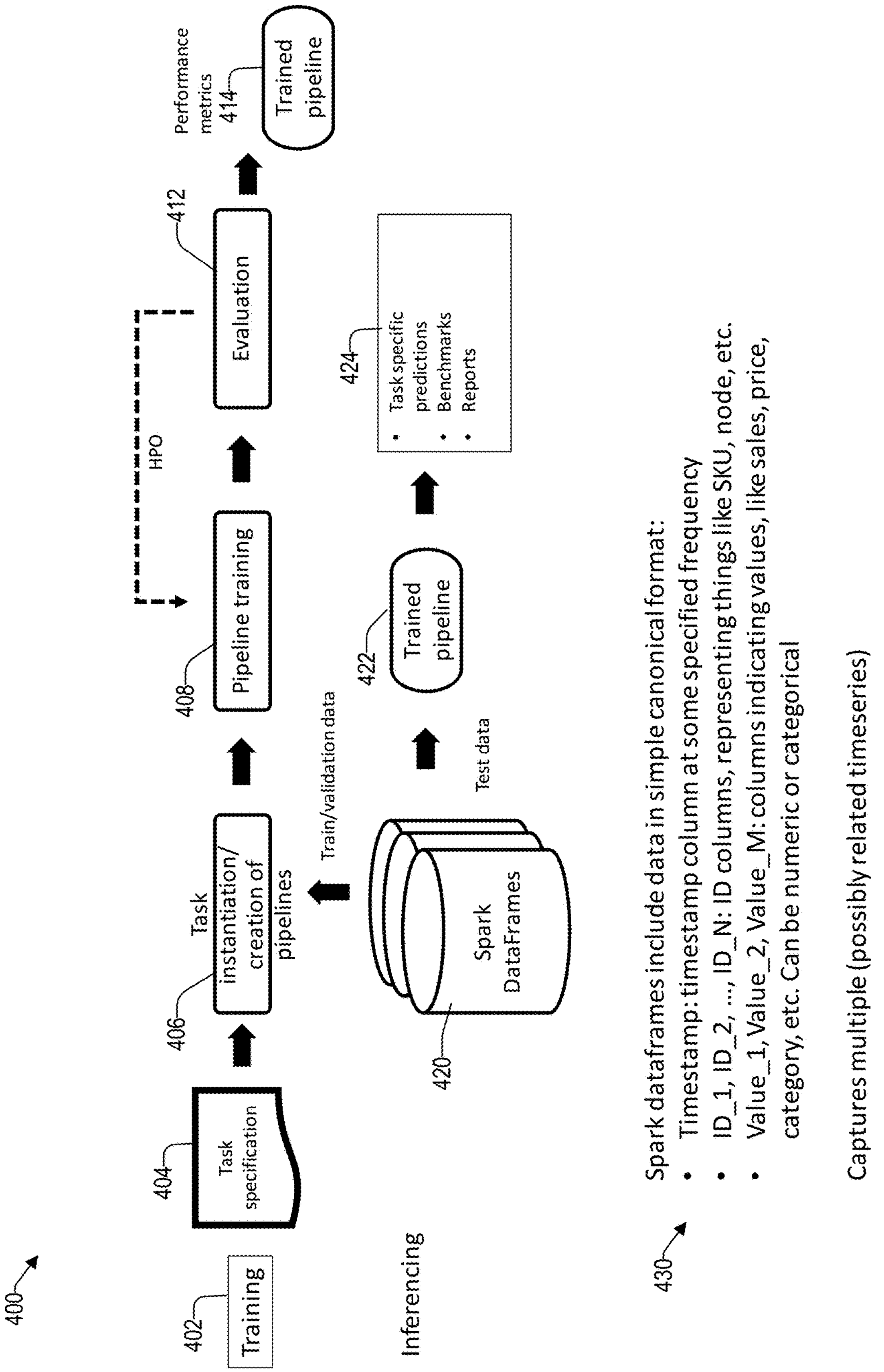
FIG. 4 is a conceptual block diagram of a toolkit high-level flow, consistent with an illustrative embodiment.

FIG. 4 is a conceptual block diagram 400 of an efficiency engine high-level flow, consistent with an illustrative embodiment. There may be two main stages for any predictive modeling task training 402 in which the model or modeling pipeline is fit to the available data, and inference or predicting (shown below) in which a trained model or modeling pipeline is applied to some data to generate predictions. The modeling task and specification (e.g., configuration) is given by a task specification 404. This task specification 404 defines the set of components to be included in the modeling pipeline, such as missing date filling, missing value imputation, aggregation, feature transformation, a specific set of forecast models, etc., along with the set or range of settings to try for each of these, such as the imputation method and hyper-parameters—which are model settings that change the behavior of a model, and the forecast model hyper-parameters—e.g., the number of layers and neurons per layer, and the learning rate, for a deep neural net, etc.

Based on the task specification, a pipeline object 406 is instantiated that has all of the specified modeling steps. The pipeline is then trained 408 and evaluated 412 on training and evaluation data 420, in parallel as much as computing resources allow, for different settings or hyper-parameters to perform hyper-parameter optimization (HPO)—that is to find the best settings/hyper-parameters for that pipeline and given set of input data and time series. In this way, splitting up the task to use different trained versions (i.e., different settings) of the modeling pipeline for different subset groups of time series enables selecting the best hyper parameter settings per group. In terms of the hyper-parameter optimization, each task and corresponding pipeline will be run for many different settings, and as mentioned previously, a small subset of these settings can be used to determine the partitioning level, either randomly sampled or according to modeling complexity. The output is a trained pipeline 414 along with its performance metrics on the data. Test data 420 is then passed to a trained pipeline 422 to get usable prediction outputs—i.e., predictions for each task, benchmarking results, reports, etc. 424. In the general approach illustrated in the example of FIG. 4, input data is in a canonical form of Spark dataframes with specific fields 430.

Example Process

Figure 5:
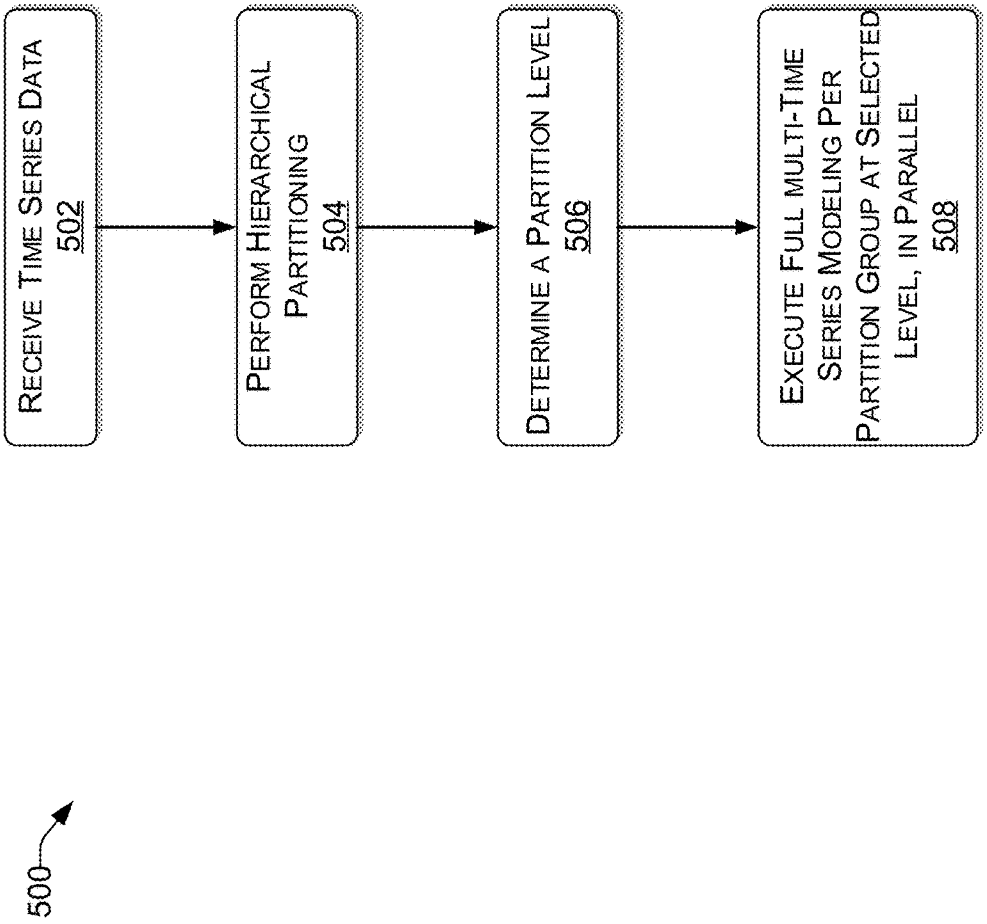
FIG. 5 presents an illustrative process for partitioning a time series data into groups at different partition levels that can be accommodated by a computing platform and execution of the full multi-time series modeling, consistent with an illustrative embodiment.

With the foregoing overview of the architecture 100 of a system for scalable modeling of large collections of time series data, and a discussion of a block diagram of a system 200 for time series partitioning and task creation, it may be helpful now to consider a high-level discussion of an example process. To that end, FIG. 5 presents an illustrative process 500 for partitioning a time series data into partition levels that can be accommodated by a computing platform and execution of the full multi-time series modeling, consistent with an illustrative embodiment. This process may be performed by the efficiency engine 103 of an efficiency server 130. Process 500 is illustrated as a collection of blocks in a logical flowchart representing a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform particular functions or implement particular abstract data types. The order in which the operations are described is not intended to be construed as a limitation, and any number of the described blocks can be combined in any order and/or performed in parallel to implement the process. For discussion purposes, the process 500 is described with reference to the architecture 100 of FIG. 1.

At block 502, time series data is received by the efficiency engine 103. In various embodiments the time series data may be received directly from various nodes 103(1) to 103(N) (i.e., 140) and/or from a time series data repository 114 (i.e., 115). At block 504, hierarchical partitioning is performed on the serial data.

At block 504, the efficiency engine 103 determines an optimal partition level of the hierarchy based on the available computing resources. To that end, an initial determination of the computing resources may be performed. In one embodiment, the efficiency engine 103 performs a test by performing partial modeling for a few groups from the levels at the set of candidate levels (in parallel) to test accuracy and computation time for each, to confirm the computational capability.

Upon determining the computational capability of the computing platform that is to perform the processing of the time series data, at block 506, a partitioning level is selected that can accommodate the processing of the time series data in a predetermined time period and a predetermined threshold accuracy.

At block 508 the efficiency engine 103 executes each task in the selected partition level on a corresponding computing node, in parallel. For example, since a partition is the assignment of all time series to groups (AKA clusters)—i.e., splitting the time series into a set of different groups—the partition itself is the collection of all of the groups. The efficiency engine 103 performs the modeling for each group in the partition—i.e., a different, separate predictive model (e.g., a cross-time series or multivariate model) is fit to each group in the partition. A different model is created for each group. Accordingly, the number of models equals the number of groups in the partition. For example, consider a time series IDs {1,2,3,4,5}. One partition would be: {{1,2}, {3,4,5}}. In the present example, this partition has two groups (sometimes referred to herein as "parts," "blocks," or "cells") with two and three time series respectively, and for each group a separate model is trained using and based on all the time series in that group. The first group is {1,2} the second group is {3,4,5}. Another partition would be: {{1, 3},{4,2},{5}}. In this example, the partition has three groups, and 3 predictive models (or modeling pipelines) would result from the modeling process.

In one embodiment, each cross-time-series modeling task for each partition group includes identifying the best set of models and components for that partition by selecting one or more best hyper-parameters and settings in the process of modeling which are specific to that partition group, including data transformation and preprocessing, exogenous data feature construction and inclusion, and time series modeling—thereby enabling greater modeling accuracy than using one partition or individual time series modeling by allowing best settings for different subsets of related time series.

In one embodiment, each modeling task for cross-time-series modeling for each group of related time series in the partition is executed in parallel by leveraging distributed computing frameworks, to enable scalability and efficiently achieving time series modeling results for the whole collection of time series. The time series hierarchical partitioning can be determined by domain knowledge and semantic modeling such that partitioning can be applied in a domain-agnostic way.

In one embodiment, the time series hierarchical partitioning is determined by scalable data analysis determining relationships between time series, such as strength of matching different attributes/characteristics, strength of historical correlation and dependence between series, etc., which can be translated into a graph with time series as nodes, and edges representing relationships and their strength. Scalable hierarchical graph partitioning can be applied to determine the hierarchical partitioning.

In one embodiment, selecting a level in the hierarchical partitioning to perform the modeling is performed by selecting a subset of levels meeting criteria for min and max data size based on modeling considerations and estimating modeling accuracy and/or efficiency for those levels, as well as selecting the best level based on meeting accuracy and efficiency requirements. For example, the most accurate level within efficiency requirements or the most efficient level within accuracy requirements can be selected.

In one embodiment, the accuracy and efficiency of modeling at each level in the subset is estimated by running partial modeling tasks (for example, training within a time budget such as for a limited number of iterations and/or for a subset of settings) for subsets of groups within each level, in parallel across computing resources—to estimate how long each group at each level takes to execute and how accurate modeling is at each level by measuring accuracy and efficiency for each of these test groups submitted and extrapolating to the full set of groups in a level. The extrapolation of accuracy may be performed by estimating the relationship between the time budget and accuracy of the model by evaluating the modeling accuracy at different points in time during the partial modeling to estimate the relationship and convergence.

In one embodiment, each group in each hierarchical partitioning level can include one or more additional aggregate time series from other groups to potentially improve the per-group cross-time series modeling without affecting the scalability. The mean (and/or other statistics) value aggregate series across all groups may be added as a series to each group to enable capturing global series information when modeling within a group. In one embodiment, the mean (and/or other statistics) value aggregate series for each other group in the same level may be added as a series to each group to enable capturing cross-group relationships when modeling within a group, if the number of groups is relatively small.

Example Computer Platform

Figure 6:
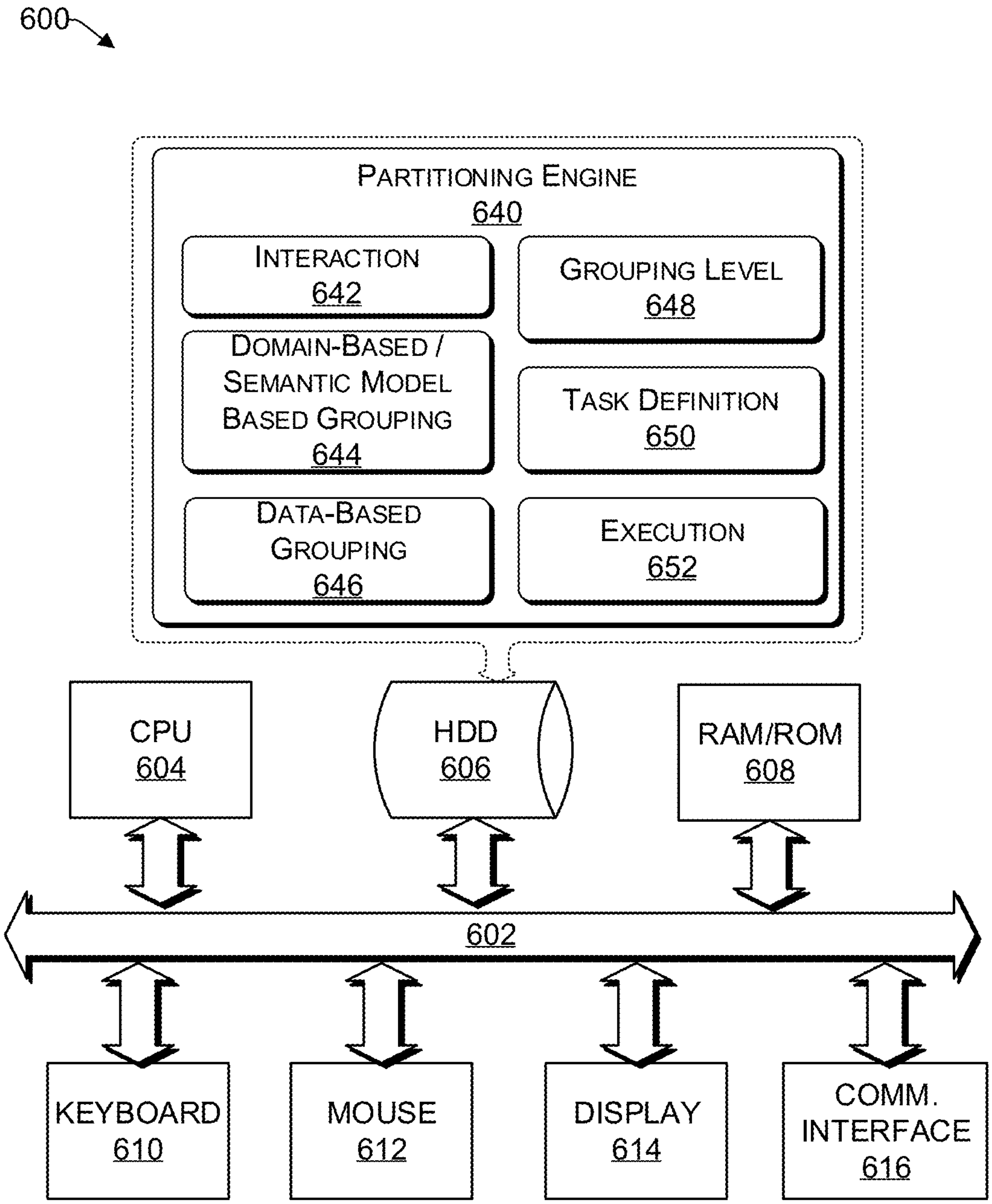
FIG. 6 provides a functional block diagram illustration of a computer hardware platform that may be used to implement the functionality of the efficiency server of FIG. 1.

As discussed above, functions relating to implementing a system for determining an appropriate partition of time series to perform cross-series modeling in parallel, where each partition forms a forecasting task that can be run in parallel, can be performed with the use of one or more computing devices connected for data communication via wireless or wired communication, as shown in FIG. 1 and in accordance with the process of FIG. 5. FIG. 6 provides a functional block diagram illustration of a computer hardware platform 600 that may be used to implement the functionality of the efficiency server 130 of FIG. 1.

The computer platform 600 may include a central processing unit (CPU) 604, random access memory (RAM) and/or read only memory (ROM) 606, a hard disk drive (HDD) 608, a keyboard 610, a mouse 612, a display 614, and a communication interface 616, which are connected to a system bus 602.

In one embodiment, the HDD 608, has capabilities that include storing a program that can execute various processes, such as efficiency engine 640, in a manner described herein. The efficiency engine 640 may have various modules configured to perform different functions to determine the setting of parameters for each cluster of nodes. For example, there may be an interaction module 642 that is operative to receive time series data from various sources, including time series data 115 from the time series data repository 114, time series data 140 from various input nodes that may be in different locations, and/or other data that may be in the cloud 120.

In one embodiment, there is a first grouping module 644 operative to perform a domain-based/semantic model-based grouping. Alternatively, or in addition, there may be a data-based grouping module 646.

There may be a grouping level module 648 operative to perform a hierarchical partitioning of the time series data.

There may be a task definition module 650 operative to determine an optimal partition level based on the available computing resources. Each group of time series data represents a task that is to be processed by a computing device represented by computing nodes 150(1) to 150(N).

There may be an execution module 652 operative to distribute the tasks to one or more computing devices 150(1) to 150(N), such that they are processed in parallel, based on a selected partition level.

Example Cloud Platform

As discussed above, functions relating to implementing a system for determining an appropriate partition of time series to perform cross-series modeling on in parallel, where each partition forms a forecasting task that can be run in parallel, may include a cloud. It is to be understood that although this disclosure includes a detailed description on cloud computing, implementation of the teachings recited herein are not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 7:
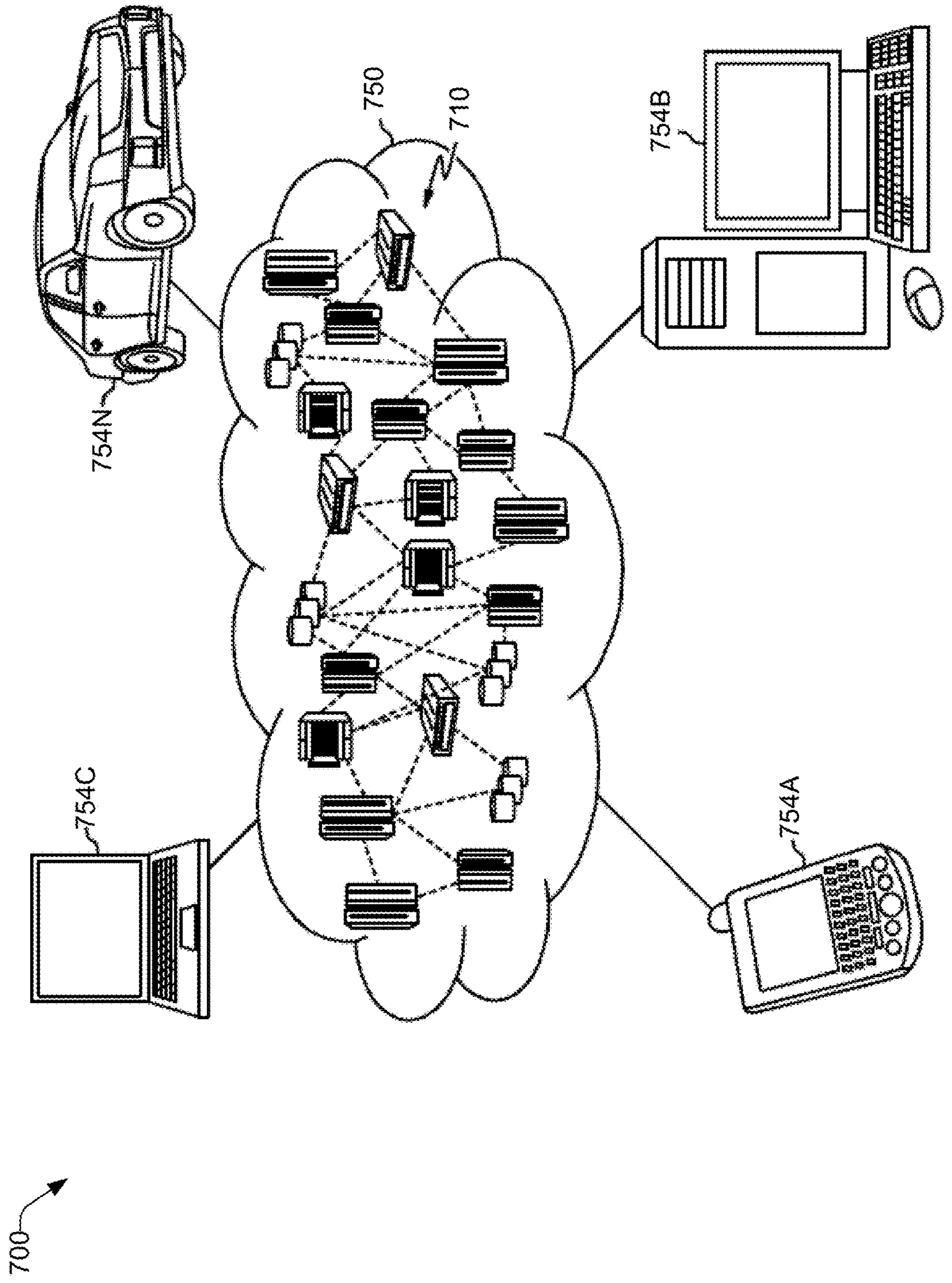
FIG. 7 depicts a cloud computing environment according to an illustrative embodiment.

Referring now to FIG. 7, an illustrative cloud computing environment 700 is depicted. As shown, cloud computing environment 700 includes one or more cloud computing nodes 710 with which local computing devices used by cloud consumers, such as, for example, personal digital assistant (PDA) or cellular telephone 754A, desktop computer 754B, laptop computer 754C, and/or automobile computer system 754N may communicate. Nodes 710 may communicate with one another. They may be grouped (not shown) physically or virtually, in one or more networks, such as Private, Community, Public, or Hybrid clouds as described hereinabove, or a combination thereof. This allows cloud computing environment 750 to offer infrastructure, platforms and/or software as services for which a cloud consumer does not need to maintain resources on a local computing device. It is understood that the types of computing devices 754A-N shown in FIG. 7 are intended to be illustrative only and that computing nodes 710 and cloud computing environment 750 can communicate with any type of computerized device over any type of network and/or network addressable connection (e.g., using a web browser).

Figure 8:
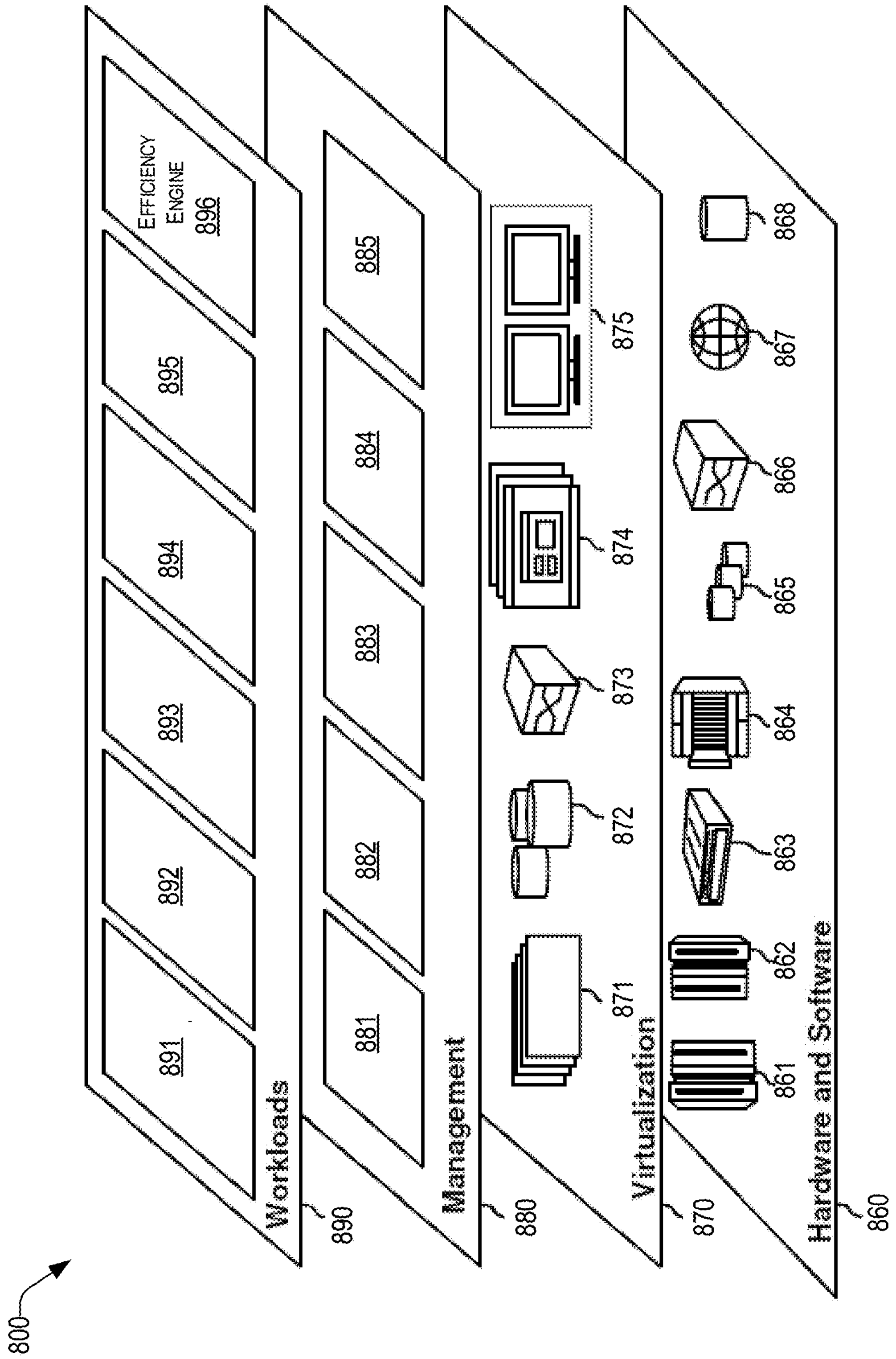
FIG. 8 depicts abstraction model layers according to an illustrative embodiment.

Referring now to FIG. 8, a set of functional abstraction layers provided by cloud computing environment 750 (FIG. 7) is shown. It should be understood in advance that the components, layers, and functions shown in FIG. 8 are intended to be illustrative only and embodiments of the disclosure are not limited thereto. As depicted, the following layers and corresponding functions are provided:

Hardware and software layer 860 includes hardware and software components. Examples of hardware components include: mainframes 861; RISC (Reduced Instruction Set Computer) architecture based servers 862; servers 863; blade servers 864; storage devices 865; and networks and networking components 866. In some embodiments, software components include network application server software 867 and database software 868.

Virtualization layer 870 provides an abstraction layer from which the following examples of virtual entities may be provided: virtual servers 871; virtual storage 872; virtual networks 873, including virtual private networks; virtual applications and operating systems 874; and virtual clients 875.

In one example, management layer 880 may provide the functions described below. Resource provisioning 881 provides dynamic procurement of computing resources and other resources that are utilized to perform tasks within the cloud computing environment. Metering and Pricing 882 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 883 provides access to the cloud computing environment for consumers and system administrators. Service level management 884 provides cloud computing resource allocation and management such that required service levels are met. Service Level Agreement (SLA) planning and fulfillment 885 provide pre-arrangement for, and procurement of, cloud computing resources for which a future requirement is anticipated in accordance with an SLA.

Workloads layer 890 provides examples of functionality for which the cloud computing environment may be utilized. Examples of workloads and functions which may be provided from this layer include: mapping and navigation 891; software development and lifecycle management 892; virtual classroom education delivery 893; data analytics processing 894; transaction processing 895; and efficiency engine 896.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to a flowchart illustration and/or block diagram of a method, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the FIGS. illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the FIGS. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A computing device, comprising:

a processor;

a network interface coupled to the processor to enable communication over a network;

a storage device coupled to the processor; and an engine stored in the storage device, wherein an execution of the engine by the processor configures the computing device to perform acts comprising:

receiving time series data comprising a plurality of time series;

partitioning the time series data to generate a plurality of groups of time series, wherein each group of time series of the plurality of groups of time series comprises respective one or more time series of the plurality of time series, the generating of the plurality of groups of time series comprises;

clustering the time series data into a hierarchy of partitions of related one or more time series of the plurality of time series, the hierarchy having different partition levels; and merging two or more groups of the plurality of groups of time series based on a number of the respective one or more time series in each of the two or more groups, and the related one or more time series correspond to the respective one or more time series of the plurality of time series;

determining a hardware computation capability of a computing platform by evaluating a hardware capability and a present computational load of the computing platform, wherein the hardware capability of the computing platform is selected from the group consisting of: a number of processors of the computing platform, an amount of memory of the computing platform, and a clock speed of the computing platform;

selecting a partition level from the different partition levels, based on the determined hardware computation capability and a modeling accuracy associated with a group focused training of forecasting models;

defining one or more modeling tasks based on the selected partition level, each modeling task of the one or more modeling tasks comprising a respective group of time series of the plurality of groups of time series; and executing the group focused training of the forecasting models in parallel on the computing platform, wherein each modeling task of the one or more modeling tasks corresponds to the executing of the group focused training of a respective forecasting model of the forecasting models using all the time series in the respective group of time series.

2. The computing device of claim 1, wherein each partition level of the different partition levels includes respective one or more groups of time series of the plurality of groups of time series.

3. The computing device of claim 2, wherein each group of time series of the respective one or more groups of time series includes a same number of time series of the plurality of time series.

4. The computing device of claim 1, wherein the determining of the hardware computation capability comprises receiving the hardware computation capability from a reference database.

5. The computing device of claim 1, wherein the determining of the hardware computation capability comprises performing an initial approximation by performing partial modeling of the plurality of groups of time series at the different partition levels on the computing platform.

6. The computing device of claim 1, wherein the selecting of the partitioning level is based on a highest time efficiency, among a plurality of time efficiencies associated with the group focused training of the forecasting models, for a predetermined accuracy associated with the group focused training of the forecasting models.

7. The computing device of claim 1, wherein the selecting of the partitioning level is based on a highest accuracy, among a plurality of accuracies associated with the group focused training of the forecasting models, for a predetermined time efficiency associated with the group focused training of the forecasting models.

8. The computing device of claim 1, wherein, for each modeling task of the one or more modeling tasks, a cross-time-series modeling is performed, at the selected partition level, in parallel.

9. The computing device of claim 1, wherein the clustering of the time series data is performed by a domain-based and/or a semantic model-based clustering.

10. The computing device of claim 1, wherein:

the computing platform comprises a plurality of computing nodes, and the determining of the hardware computation capability of the computing platform is performed separately for each computing node of the plurality of computing nodes.

11. A non-transitory computer readable storage medium tangibly embodying a computer readable program code having computer readable instructions that, when executed, causes a computer device to carry out a method of improving a computational efficiency of a computing platform in processing time series data, the method comprising:

receiving the time series data comprising a plurality of time series;

partitioning the time series data to generate a plurality of groups of time series, wherein each group of time series of the plurality of groups of time series comprises respective one or more time series of the plurality of time series, the generating of the plurality of groups of time series comprises:

clustering the time series data into a hierarchy of partitions of related one or more time series of the plurality of time series, the hierarchy having different partition levels; and merging two or more groups of the plurality of groups of time series based on a number of the respective one or more time series in each of the two or more groups, and the related one or more time series correspond to the respective one or more time series of the plurality of time series;

determining a hardware computation capability of the computing platform by evaluating a hardware capability and a present computational load of the computing platform, wherein the hardware capability of the computing platform is selected from the group consisting of: a number of processors of the computing platform, an amount of memory of the computing platform, and a clock speed of the computing platform;

selecting a partition level from the different partition levels, based on the determined hardware computation capability and a modeling accuracy associated with a group focused training of forecasting models;

defining one or more modeling tasks based on the selected partition level, each modeling task of the one or more modeling tasks comprising a respective group of time series of the plurality of groups of time series; and executing the group focused training of the forecasting models in parallel on the computing platform, wherein each modeling task of the one or more modeling tasks corresponds to the executing of the group focused training of a respective forecasting model of the forecasting models using all the time series in the respective group of time series.

12. The non-transitory computer readable storage medium of claim 11, wherein each partition level of the different partition levels includes respective one or more groups of time series of the plurality of groups of time series.

13. The non-transitory computer readable storage medium of claim 11, wherein the determining of the hardware computation capability comprises receiving the hardware computation capability from a reference database.

14. The non-transitory computer readable storage medium of claim 11, wherein the determining of the hardware computation capability comprises performing an initial approximation by performing partial modeling of the plurality of groups of time series at the different partition levels on the computing platform.

15. The non-transitory computer readable storage medium of claim 11, wherein the selecting of the partitioning level is based on a highest time efficiency, among a plurality of time efficiencies associated with the group focused training of the forecasting models, for a predetermined accuracy associated with the group focused training of the forecasting models.

16. The non-transitory computer readable storage medium of claim 11, wherein the selecting of the partitioning level is based on a highest accuracy, among a plurality of accuracies associated with the group focused training of the forecasting models, for a predetermined time efficiency associated with the group focused training of the forecasting models.

17. The non-transitory computer readable storage medium of claim 11, wherein, for each modeling task of the one or more modeling tasks, a cross-time-series modeling is performed, at the selected partition level, in parallel.

18. The non-transitory computer readable storage medium of claim 11, wherein the clustering of the time series data is performed by a domain-based and/or a semantic model-based clustering.

19. The non-transitory computer readable storage medium of claim 11, wherein:

the computing platform comprises a plurality of computing nodes, and the determining of the hardware computation capability of the computing platform is performed separately for each computing node of the plurality of computing nodes.

20. A computer-implemented method, comprising:

receiving time series data comprising a plurality of time series;

partitioning the time series data to generate a plurality of groups of time series, wherein each group of time series of the plurality of groups of time series comprises respective one or more time series of the plurality of time series, the generating of the plurality of groups of time series comprises;

clustering the time series data into a hierarchy of partitions of related one or more time series of the plurality of time series, the hierarchy having different partition levels; and merging two or more groups of the plurality of groups of time series based on a number of the respective one or more time series in each of the two or more groups, and the related one or more time series correspond to the respective one or more time series of the plurality of time series;

determining a hardware computation capability of a computing platform by evaluating a hardware capability and a present computational load of the computing platform, wherein the hardware capability of the computing platform is selected from the group consisting of: a number of processors of the computing platform, an amount of memory of the computing platform, and a clock speed of the computing platform;

selecting a partition level from the different partition levels, based on the determined hardware computation capability and a modeling accuracy associated with a group focused training of forecasting models;

defining one or more modeling tasks based on the selected partition level, each modeling task of the one or more modeling tasks comprising a respective group of time series of the plurality of groups of time series; and executing the group focused training of the forecasting models in parallel on the computing platform, wherein each modeling task of the one or more modeling tasks corresponds to the executing of the group focused training of a respective forecasting model of the forecasting models using all the time series in the respective group of time series.

* * * * *